United States Patent
Bult

(10) Patent No.: US 6,573,851 B2
(45) Date of Patent: Jun. 3, 2003

(54) OFFSET COMPENSATED COMPARING AMPLIFIER

(75) Inventor: Klaas Bult, Bosch (NL)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/079,814

(22) Filed: Feb. 22, 2002

(65) Prior Publication Data

US 2003/0001768 A1 Jan. 2, 2003

Related U.S. Application Data

(60) Provisional application No. 60/270,672, filed on Feb. 22, 2001.

(51) Int. Cl.[7] .............................................. H03M 1/12
(52) U.S. Cl. ....................................... 341/155; 341/172
(58) Field of Search ................................ 341/172, 155, 341/143

(56) References Cited

PUBLICATIONS

Andrew G.F. Dingwall, "THAM 11.1: Monolithic Expandable 6b 15MHz CMOS/SOS A/D Converter", Feb. 15, 1979, Entire Article, 1979 IEEE International Solid–State Circuits Conference.

"Understanding Flash ADCs", Sep. 2001, Entire Article, http://dbserv.maxim–ic.com.

Doug Gingrich, "Parallel–Encoding ADC (flash ADC)", date unknown, Entire Article, http://www.phys.ualberta.ca.

"Analog–to–Digital Converter Types", date unknown, Article, http://www.astro–med.com/.

"Four Types of Analog–to–Digital Converter", date unknown, Article, http://www.industrailtechnology.co.uk/1997/.

Mark Freed, Geff Ottman, "Analog to Digital Converter Implementation: Flash ADC, CSE 477—Specification Report", Oct. 11, 2001.

*Primary Examiner*—Peguy Jeanpierre
(74) *Attorney, Agent, or Firm*—Sterne, Kessler, Goldstein & Fox, P.L.L.C.

(57) ABSTRACT

A system and method for converting an analog input signal to a N-bit digital output signal. The invention comprises generating a plurality of reference voltage signals; pre-amplifying, separately, a difference between each of the plurality of reference voltage signals and an analog input signal using a plurality of cascaded, differential, switched-capacitor circuits to output a plurality of pre-amplified difference signals; and determining a zero-crossing result for each of the plurality of pre-amplified difference signals. Then one of a binary 1 and a binary 0 are assigned to each of the compared, pre-amplified signals. The binary 1's and 0's are encoded as an M-bit encoded signal, which is then decoded to output an N-bit digital output signal, wherein M is less that or equal to N.

9 Claims, 14 Drawing Sheets

OFFSET COMPENSATED COMPARING AMPLIFIER

CROSS-REFERENCE TO RELATED APPLICATION

This application claims the benefit of U.S. Provisional Application No. 60/270,672, filed Feb. 22, 2001, which is incorporated herein by reference.

BACKGROUND OF THE INVENTION

1. Field of the Invention

The present invention pertains to analog-to-digital converters (ADCs), and more specifically, is directed to an apparatus and method used to pre-amplify the differential input signal in the comparator stage of a high-speed analog-to-digital converter (ADC).

2. Background Art

Applications such as high-end video signal processing, high performance digital communications, medical imaging, and the like, require analog-to-digital conversion with high sample rates and a large dynamic range. In response to these needs, there is a continued search for circuit architecture and techniques enabling an ADC to meet the specifications with reasonable chip size area and small power dissipation. It is of particular interest if such ADCs can be fabricated in standard CMOS technologies.

Most published ADCs that come close to the mentioned specifications are bipolar implementations. Their high speed and wide dynamic range owes to the use of open-loop precise, building blocks, including low-offset comparators. CMOS ADCs, by contrast, tend to use closed loop amplifier circuits for precise analog signal processing and close-loop, auto-zeroed, comparators in quantizers that resolve 4 bits or more. It is therefore difficult for CMOS circuits to attain the dynamic range of a bipolar ADC built with devices of comparable frequency capabilities. Implemented using comparable frequency capabilities the bipolar transistors are much faster than the CMOS transistors.

Another problem the high-speed ADCs implemented in CMOS technologies involves finite matching of the components on the chip. Specially, if small transistor sizes are used, then the mismatch results in large offset voltages. Such offset voltages have a substantial effect on differential non-linearity and the integral non-linearity of the ADC. Furthermore, electronic elements implemented using CMOS technologies have a reduced supply voltage because of the large electric field occurring in the device channels. A small reference voltage is required for such a system.

For example, a 0.18 micron ($\mu$m) device can handle 1.8 volts (V), while for a 0.12 $\mu$m device a 1.2V supply voltage is required. In a complex ADC of N bits, the number of quantization steps can be approximated by $2^N$. An N-bit ADC must use some form of multi-stage quantization with intermediate stages between each sub-quantize step to form and amplify the analog residue. With a reference voltage of 0.5 V, maximum quantization step size, has a value of $0.5/2^N$. Thus, a 10 bit converter (n=10), has quantization step size of 0.5 mV. The offset voltage due to mismatch in submicron technologies is typically much larger that this minimum step size. An offset compensation technique is therefore required to obtain a practically operating system.

The majority of the current high speed ADCs employ a 2.5 V supply voltage. Older versions of the high speed ADC employ higher voltage supply levels. For example, 3.8 V or 5V. The transition of the circuit towards lower values of the supply voltage is difficult to make. The reason for that is the direct proportionality that exist between the value of the supply voltage and the signal level. As the value of the supply voltage decreases the level of the signal decreases. As a consequence the level of noise associated with the signal decreases and the signal associated inaccuracies have to decrease. These factors impact the dynamic range of the ADC. In order to preserve the dynamic range of the ADC at its maximum level, it is desired to reduce the noise levels as much as possible.

In order to meet the requirements imposed by technology, the levels of the power supply have to be conveniently chosen, as discussed in one of the previous paragraphs. If the level of the supply voltage is low the correspondent power dissipation is low. But, the reduction of the level of supply voltage not necessarily mens the reduction of the noise levels which are strongly related with the dynamic range. In order to keep the dynamic range high the noise levels have to be kept low. We distinguish two categories of noises: the thermal noise and the voltage offset associated noises. The thermal noises are associated with the presence of a random type behavior of the currents and the voltages in the circuit. In an ideal case the offset voltage in transistors are absent form the circuits. But the presence of random voltages causes deviation from the ideal behavior. The presence of deviation is indicated by noise. If the value of the supply voltage decreases the value of the offset voltage is also affected. The desired small offset levels and implicitly the wide dynamic range can not be achieved by reduction of the input power supply.

Other factors, such as the technology employed to implement the circuits and the nature of the transistors used, also come into play. In order to obtain a small offset voltage the transistors used have to have a larger gate area. This involves two disadvantages: the larger chip area required to implement such circuits, and the greater power supply level required to operate these transistors. Also, the speed of the circuits does not improve with the reduction of the power supply.

Therefore, what are needed is a technique that achieves reduction of the offset voltage values, without focusing on adjusting the size of the gate area.

BRIEF SUMMARY OF THE INVENTION

The present invention is directed to a method of reducing the value of offset voltage, from the comparator block in a high speed ADC.

The method involves pre-amplifying a plurality of reference voltage signals generated from a reference voltage generator in an ADC, prior being fed into a comparator block.

These and other objects are provided, according to the present invention, by a method and apparatus for converting an analog input signal to a N-bit digital output signal. First, a plurality of reference voltage signals is generated. The difference between each of the plurality of reference voltage signals and an analog input signal is pre-amplified separately. For this purpose a plurality of cascaded, differential, switched capacitor circuits is used. The switched-capacitor circuits output a plurality of pre-amplified difference signals. Each of the pre-amplified difference signals are compared to zero-crossings. A binary 1 or a binary 0 is assigned to each compared, pre-amplified signal. The binary 1's and 0's are encoded to form an M-bit encoded signal. The M-bit encoded signal is decoded to output an N-bit digital output signal.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in art. Like numbers refer to like elements throughout.

Figure 1A:
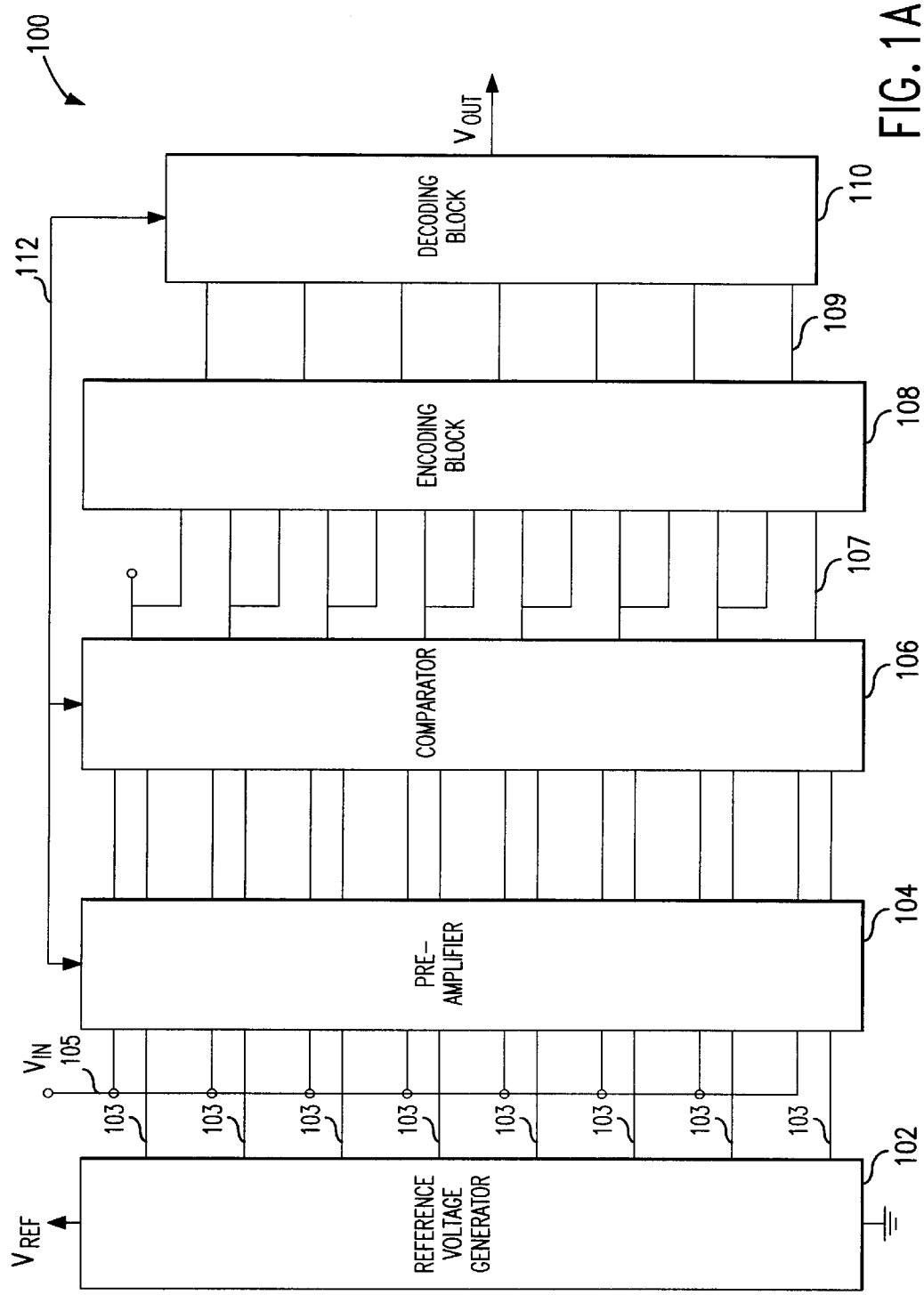
FIG. 1A illustrates an N-bit digital ADC, according to one embodiment of the present invention.

FIG. 1A represents a N-bit analog-to-digital converter (ADC) for converting an analog input signal $V_{IN}$ to a digital output signal $V_{OUT}$, according to an embodiment of the present invention. The ADC circuit includes a reference voltage generator (102), a pre-amplifier block (104), a comparator block (106), an encoding block (108), a decoding block (110), and a clock signal line (112).

The reference voltage generator (102) outputs a plurality of differential reference voltage signals 103. The plurality of differential reference voltage signals 103 and the analog input signal $V_{IN}$ (105) constitute input for the pre-amplifier block 104. The pre-amplification block amplifies the difference between each of the plurality of differential reference voltage and the analog input signal and outputs a plurality of differential pre-amplified difference signal. The comparator block 106 receives the plurality of differential pre-amplified signals and compares them with the zero crossing. Individual comparators, for example, within the comparator block 106 output assign either a binary 1 or a binary 0 to each of the compared, pre-amplified signals. The resulting binary set 107 is fed into the encoding block 108. The block 108 outputs an M-bit encoded signal 109. This M-bit encoded signal is fed into the decoding block 110, which outputs an N-bit digital output signal $V_{OUT}$.

The reference voltage generator 102 can comprise a resistive divider network. This resistive divider outputs a plurality of incrementally ascending reference voltage signals, as would be apparent to a person skilled in the art. The pre-amplifier block 104 comprises a plurality of cascaded, differential, switched-capacitor circuits. The comparator block 106 consists of a plurality of comparators, that can be implemented, for example, as amplifier circuits. Each comparator produces a 1 when its differential input signal is positive compared to the zero crossing. Otherwise the comparator assigns a 0. The digital weights and corresponding circuits can be used without departing from the spirit and scope of the invention as would be apparent to a person skilled in the art.

The decoding block comprises a plurality of logic elements, such as gates or flip-flops. The decoder block 110 comprises a set of latches, that can be D flip flops, for example. The clock signal line 112 allows a clock signal to be fed into the pre-amplifier block 104, comparator block 106 and decoding block 110, driving these blocks depending on a particular phase of the signal.

A drawback of comparators as opposed to amplifiers is that they inherently have a large offsets because of their dynamic nature. They must assign a binary 1 or a binary 0 in a limited, often very short period of time. Usually during a clock cycle. Large swing signals enter the circuit and, implicitly, the large offsets are formed at the output of the comparator block. These are dynamic offsets caused by large signals that are varying rapidly. The comparators by themselves will not have small offsets. This is the reason why the present invention employs pre-amplification. Pre-amplification usually takes as much as half a clock cycle, but the signal might not be pre-amplified sufficiently in order to overcome the high offsets of the comparators during such a short time. For that purpose, the present invention includes the pre-amplification block 104 with a cascaded, pipe-lined, differential structure.

Figure 1B:
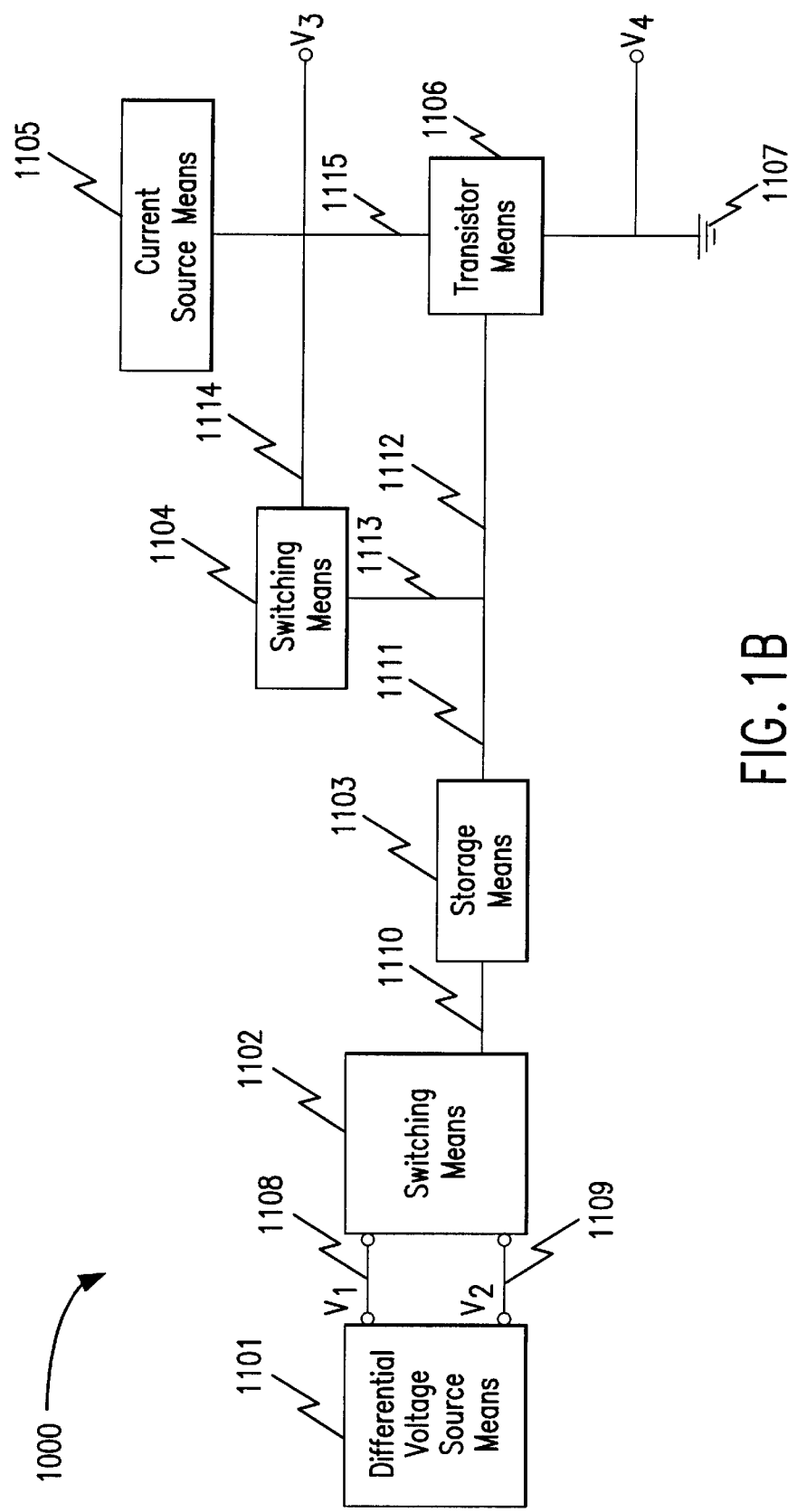
FIG. 1B is a block representation of the single ended switched-capacitor circuit, used to implement the pre-amplifying stage of the N-bit digital ADC illustrated in FIG. 1A.

The pre-amplifying block 104 comprises a plurality of cascaded, pipe-lined, differential, switched-capacitor circuits. A block representation of a single-ended switched capacitor circuit (1000) is shown in FIG. 1B. The single-ended switched capacitor circuit comprises a differential voltage source means 1101, multiple switches 1102, a storage mean 1103, transistors 1106, single switch 1104 and, current source 1105. This is a general, illustrative embodiment of the present invention which does not meant to be limiting.

The differential voltage source 1101 outputs an analog input signal 1108, and a portion of the plurality of differential reference voltage signals (1109) generated by the reference voltage generator 102. The 1108 and 1109 signals constitute inputs for a multiple switching means 1102. The switching means 1102 output a switched signal 1110 that charges the storage means 1103. The transistor means 1106 is biased with a current signal 1115 from the current source means 1105. The transistor means 1106 performs an amplification function. In the example of FIG. 1B the transistor means 1106 have their source grounded. Part of the signal 1116 output by the current source means 1114 serves to drive a single switching means 1104. The switch 1104 can be closed to short-circuit the drain to the gate of the transistor means 1106 by having the 1114 line in an opened or closed state.

Figure 1C:
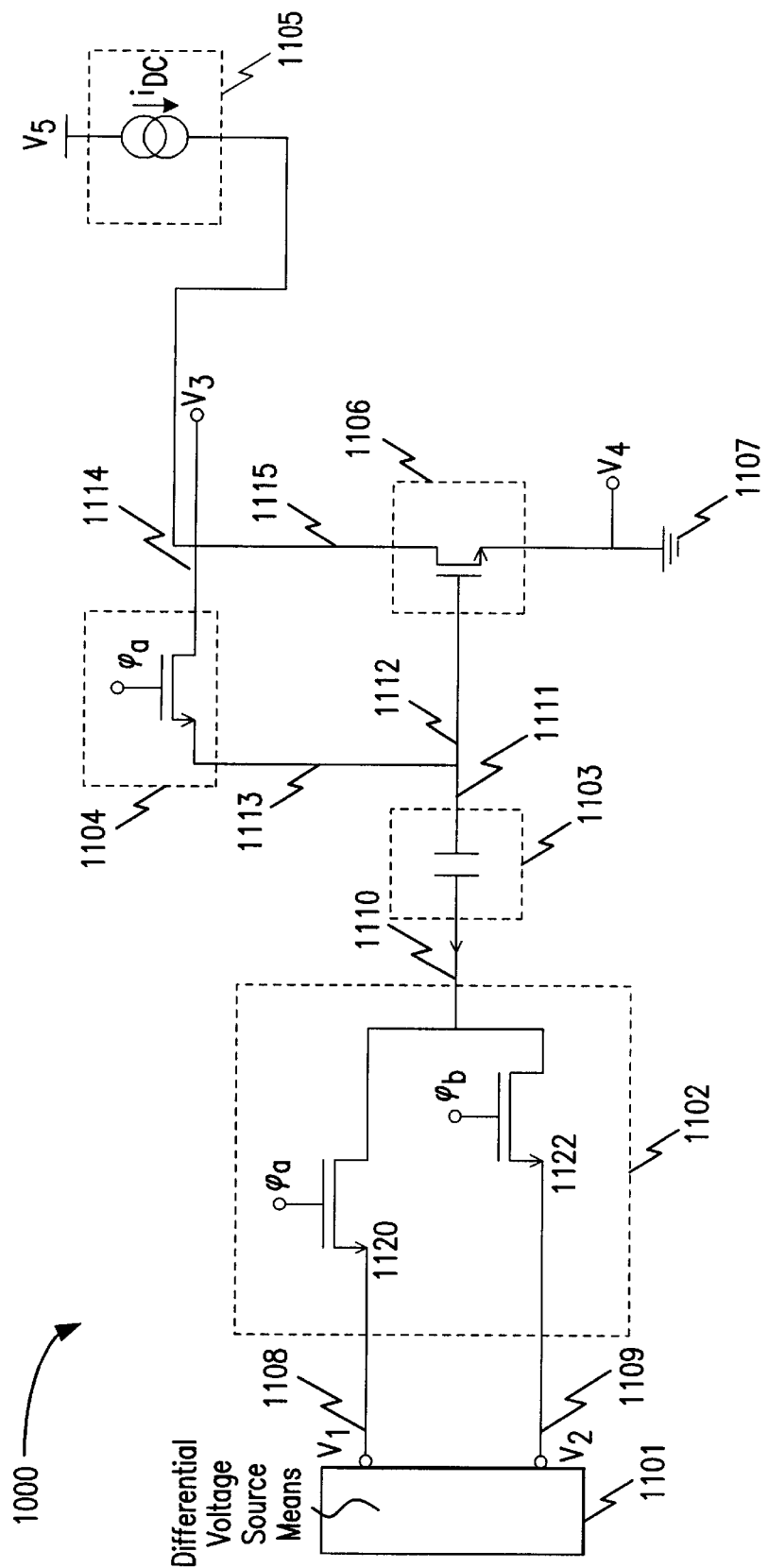
FIG. 1C is a detailed representation of the single ended switched-capacitor circuit of FIG. 1B.

FIG. 1C is a detailed representation of the single ended switched-capacitor circuit of FIG. 1B. The multiple switching means 1102 is implemented using two switched capacitors 1120 and 1122. The two capacitors can be driven by a dual clock phase signal as would be apparent to a person skilled in the art. The two different phases of the clock signal are $\phi_a$ and $\phi_b$. They are two non-overlapping clock phases. The storage means 1103 is implemented using a capacitor. The single switching means 1104 is implemented using a switched capacitor. The switched capacitor 1104 receives one phase of the clock signal and can be driven by a segment of the current signal 1116, output from the current source means 1105.

Two modes of operation can be distinguished for 1000 circuit: a track and old mode and a compare/amplification mode.

Figure 1D:
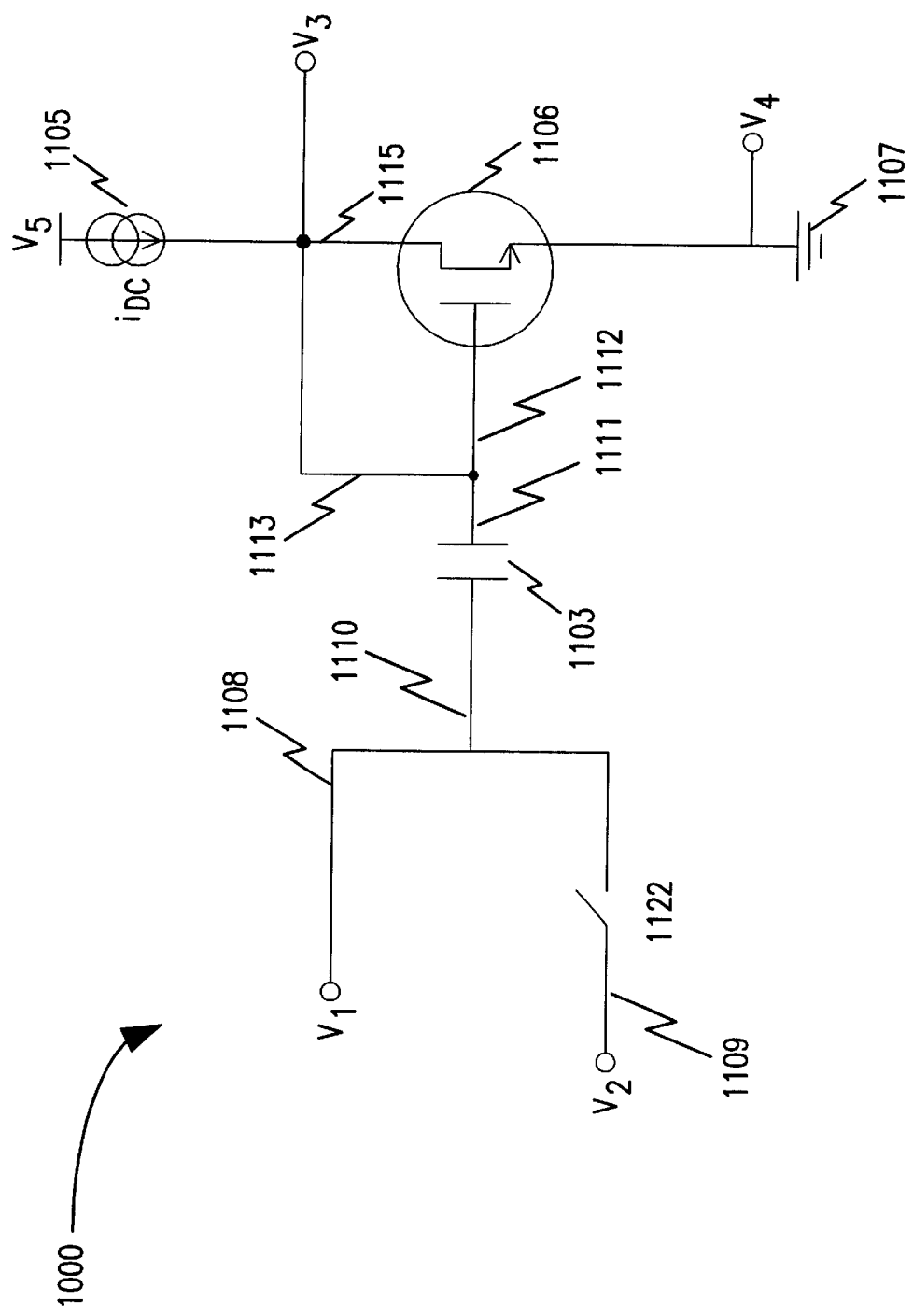
FIG. 1D illustrates the single ended switched-capacitor circuit of FIG. 1C in a track and hold mode operation.

FIG. 1D illustrates the corresponding configuration of the 1000 circuit for the track and hold mode of operation. During the track and hold mode operation, the switched capacitors 1120 and 1104 are closed. The $\phi_a$ component of the clock phase signal is high. The $\phi_b$ component of the clock phase signal is low. Implicitly, the 1122 switch capacitor is opened. This allows the analog input voltage signal 1108 to charge capacitor 1103. During this mode of operation the gate and the drain of the grounded transistor 1106 are shorted. As a result the transistor 1106 behaves like a diode. In this case the diode has low impedance. As a result, in the second lead 1111 of the capacitor 1103 can sample the gate voltage of the grounded transistor 1106. The voltage value present at line 1112 is called $V_{OFFSET}$. At the end of this mode on one lead of the capacitor 1110 sample the input voltage and second lead of the capacitor samples $V_{OFFSET}$ and the voltage of the gate of transistor 1106.

Figure 1E:
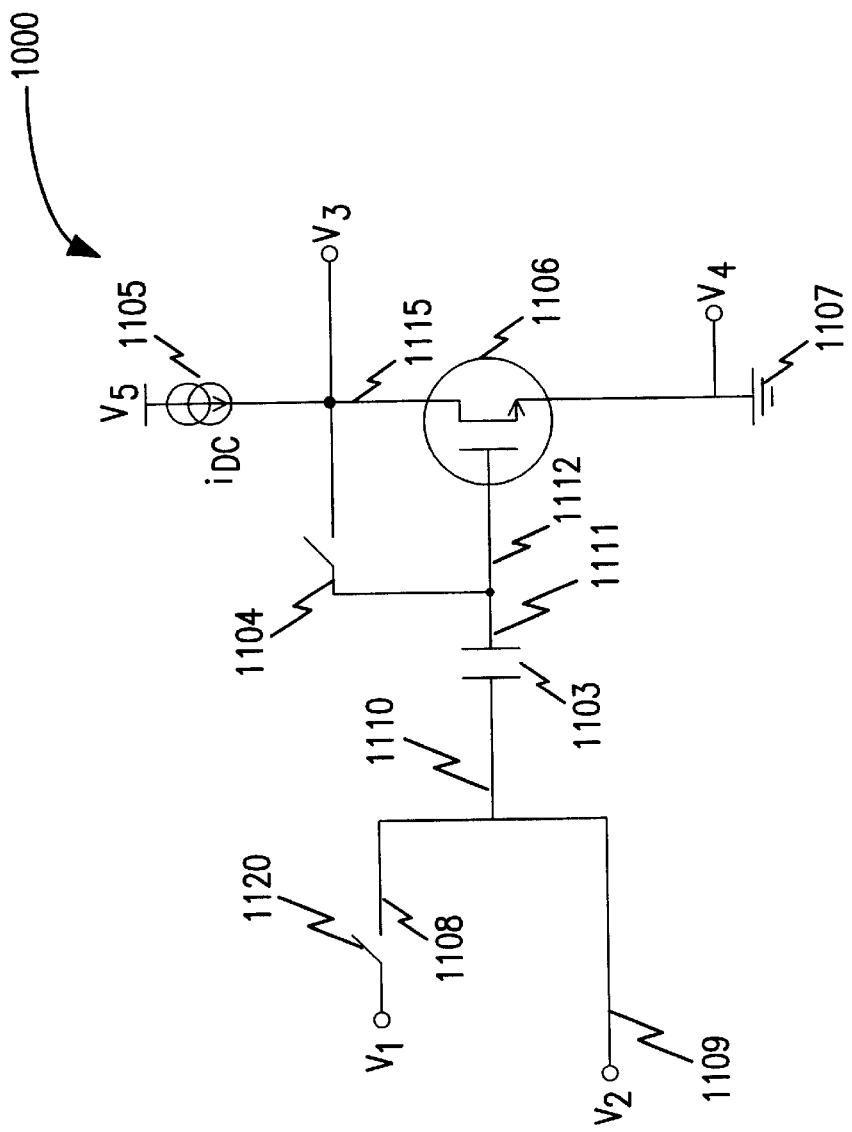
FIG. 1E illustrates single-ended switched-capacitor circuit of FIG. 1C in a compare/amplification mode operation.

FIG. 1E illustrates the corresponding configuration of the 1000 circuit for the compare/amplification mode. During this mode of operation switches 1120 and 1104 are opened and switch 1122 is closed. As a result, the portion of the output reference signal transmitted through line 1109 can be sampled by the capacitor 1103. The switch 1104 is opened. As a result the gate and the drain of the grounded transistor 1106 are not short-circuited during phase $\phi_b$ of the clock signal. The transistor 1106 functions as an amplifier. The gate voltage of transistor 1106 undergoes a shift equal to the difference between $V_{IN}$ and $V_{REF}$. This voltage shift is independent of the value of $V_{OFFSET}$. The offset voltage is still stored in the 1103 capacitor. Also, the offset voltage of a transistor is constant in time.

Figure 2A:
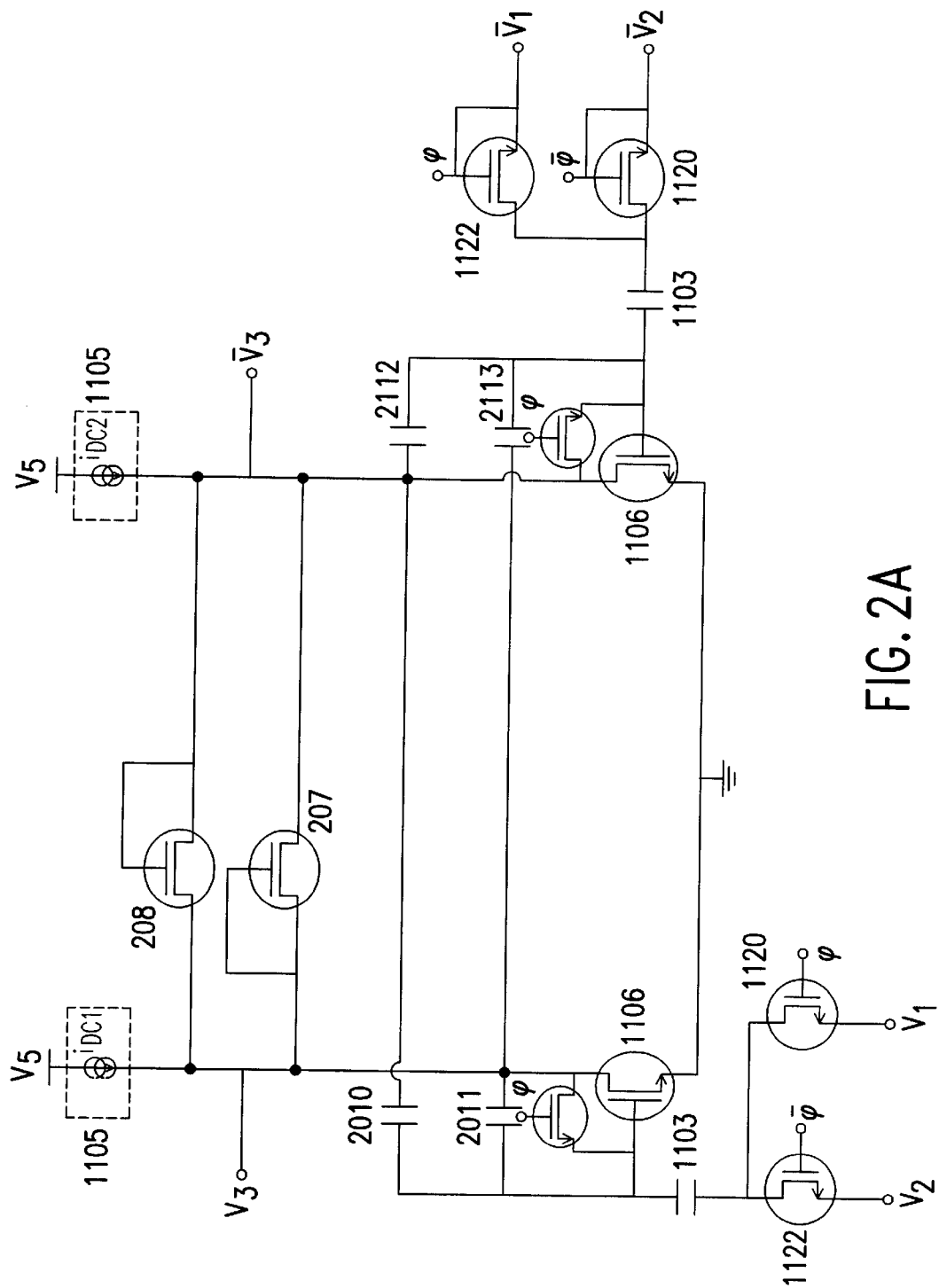
FIG. 2A is a differential representation of the circuit illustrated by FIG. 1B.

A differential implementation of the circuit illustrated in FIG. 1B is done FIG. 2A.

The circuit comprises input terminals (left and right input terminals), switched capacitors 1120 and 1122, input capacitors 1103, transistor means 1106, common feedback capacitors (2010,2011,2112,2113), output swing limiting transistors (207,208), output terminals (left and right output terminals). In an embodiment of the present invention, the capacitance of the feedback capacitors is equal. The aim of the differential implementation is to use the circuit as a differential amplifier. For this purpose, circuit bias is maintained at the bias point where the transistors 1106 operate as amplifiers. This mode of operation for the amplifiers can be achieved by maintaining a certain predetermined level at the output terminals. The four additional capacitors keep both bias input currents from the 105.1 current source means at the desired level. Without these common feedback capacitors, the gain of the circuit during common mode operation and differential mode operation would be the same. In differential mode operation a high gain is desired. Without the common feedback capacitors the gain in common mode operation would be high also. This is an undesired state that is eliminated by the presence of the common feedback capacitors. The desired state of the circuit is to allow high differential gain and very low common mode gain. The function of the four common feedback capacitors is to keep the transistors 1106 biased at the right point so that they can operate as amplifiers.

The differential circuit 1000 illustrated in FIG. 2A includes a pair of output switch limiting transistors 207 and 208. They limit the output swing, preventing to high or to low values at the output. They act as diodes and limit the swing of the amplifiers 1106.

Figure 2B:
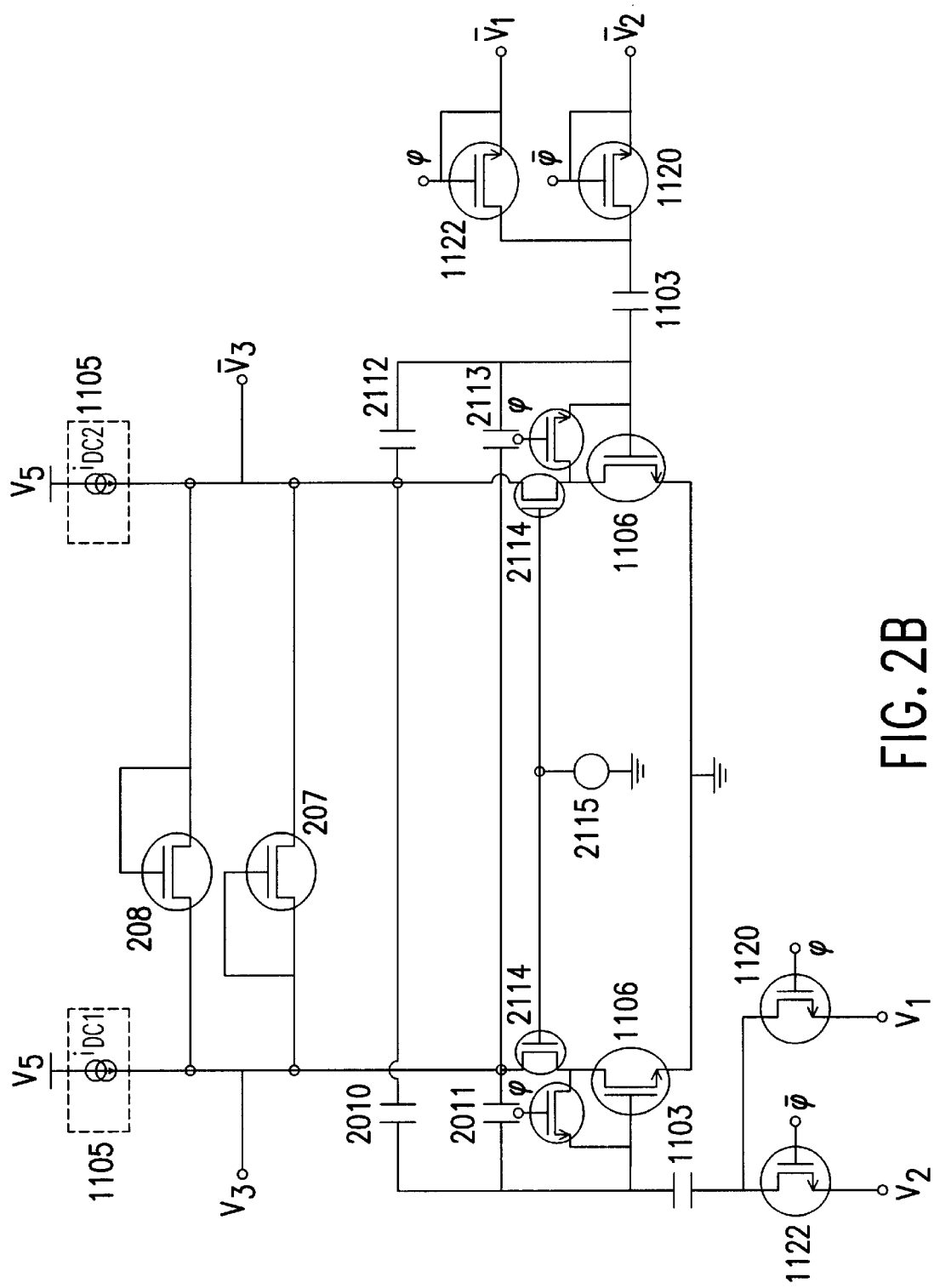
FIG. 2B illustrates the circuit of FIG. 2A, containing additional cascoded elements.

FIG. 2B illustrates the same differential implementation of the circuit 1000 as in FIG. 2A, but contains additional cascoded elements. The additional elements are two transistors 2114, which are biased from a grounded voltage source 2115. The transistors 2114 are connected with the transistors 1106 in such a way that transistors 1106 will still be saturated. The gate of the cascaded transistor is biased in a manner that allows the drain voltage of transistor 1106 to be at a voltage level corresponding to saturation. The voltage at the gate of the cascaded transistor 2114 is slightly different that the level of saturation voltage for transistor 1106. Transistors 2114 will be biased from the grounded voltage source 2115 with a voltage value just above the saturation point of the transistors 1106.

Figure 3A:
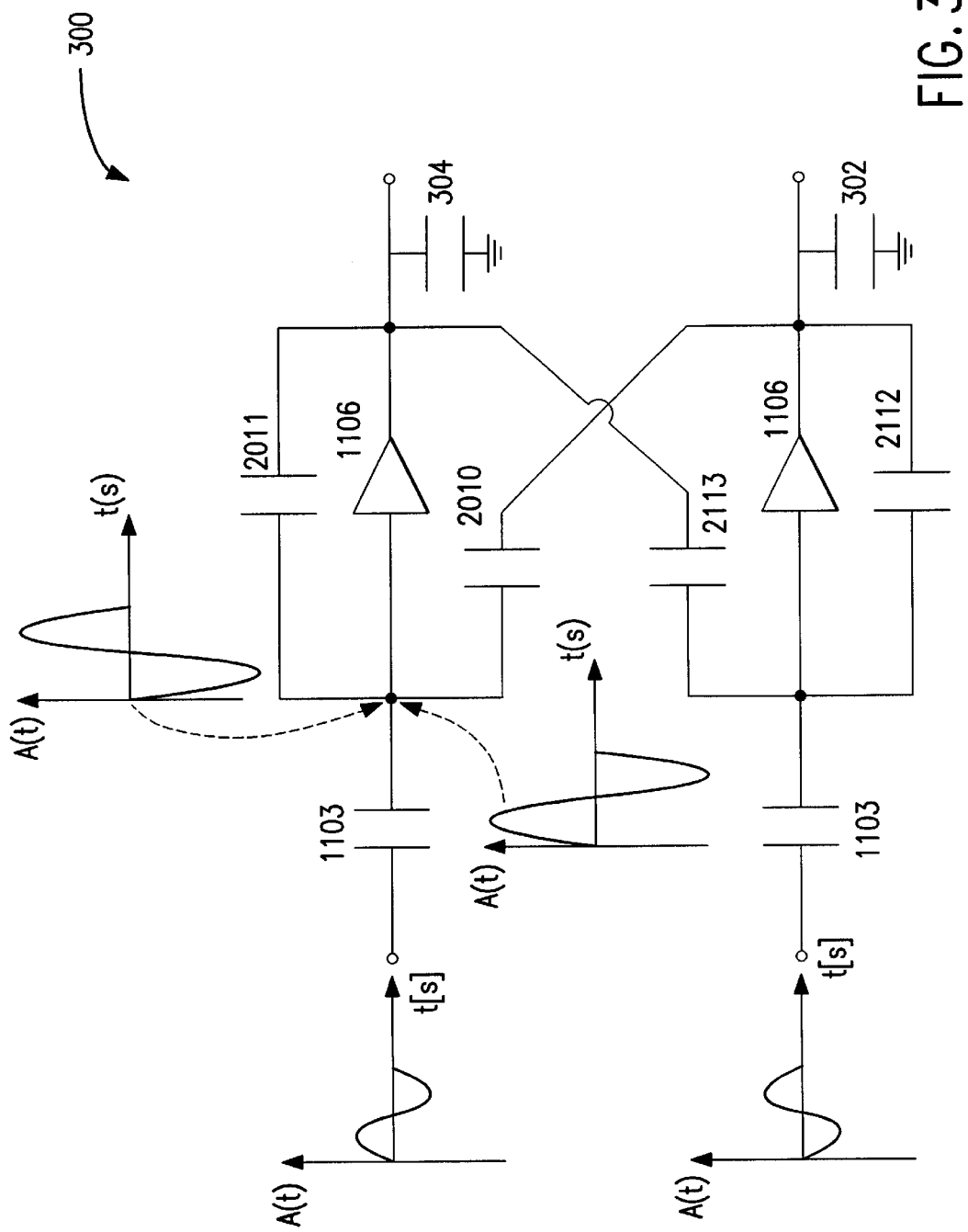
FIG. 3A is a simplified representation of the differential circuit of FIG. 2B, in a differential mode operation.

FIG. 3A is a simplified representation of the differential circuit of FIG. 2B functioning in differential mode. The 300 circuit comprises two differential amplifiers 1106, input capacitors 1103, feedback capacitors 2010, 2011, 2112, 2113, and output capacitors 302 and 304. In an embodiment of the present invention the capacitance of the feedback capacitors are equal in value. The differential amplifiers 1106 function as operational amplifiers. At the input of the 300 circuit a purely differential signal is present. As represented in the figure, during one half of a period, the signal in the upper input node goes high, while the signal in the lower input node goes low. The two signals have no common portion at the input. At the output of the circuit a purely differential signal is present. If the signal present in the upper output goes high with a certain amount the signal present at the lower output goes low with the same amplitude amount. This behavior is allowed by the presence of the feedback capacitor circuit. More important, the two feedback capacitors 2010 and 2113 allow feeding back of the signal at the input of the 1106 amplifiers. Because the signal across them is identical in value but opposite in sign, their signals will cancel at the input of the 1106 amplifier. The amplifiers 1106 drive the capacitors with their output despite of the cancellation of the differential signals. The capacitors accumulate a load for the amplifiers.

Figure 3B:
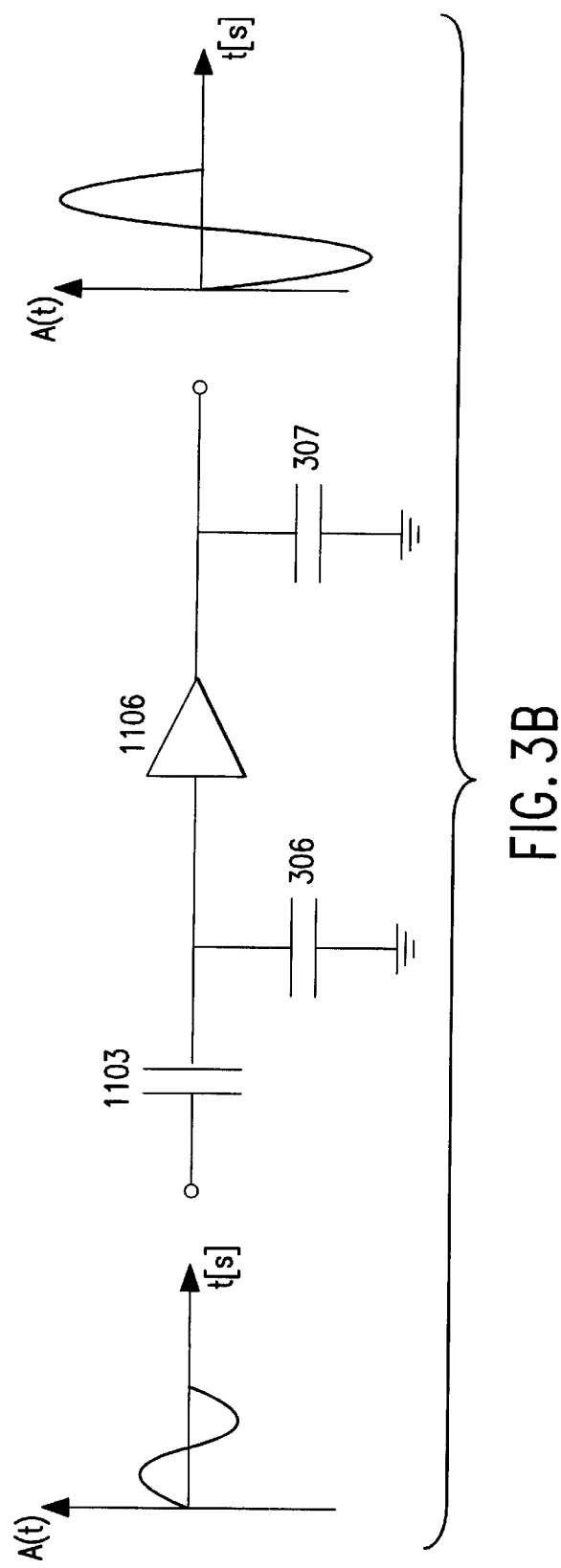
FIG. 3B is an equivalent circuit for the differential circuit represented in FIG. 3A.

FIG. 3B is the representation of an equivalent of circuit 300, represented in FIG. 3A. The figure illustrates either the upper or the lower portion of the circuit 300. The equivalent circuit comprises an input node, the input capacitor 1103, the differential amplifier 1106, a parasitic capacitor 306, an equivalent parasitic capacitor 307, and an output node. The differential amplifier 1106 functions as an operational amplifier. An inherent parasitic capacitance is represented in the equivalent circuit by the capacitance of the parasitic capacitor 306. The capacitance of the parasitic capacitor 306 is the equivalent of capacitances of capacitors 302 and 304 together with the inherent parasitic capacitance of the differential operation amplifiers. The capacitance value of capacitor 307 corresponds to the equivalent capacitance of the feedback capacitors 2010, 2011, 2112, 2113.

Figure 4A:
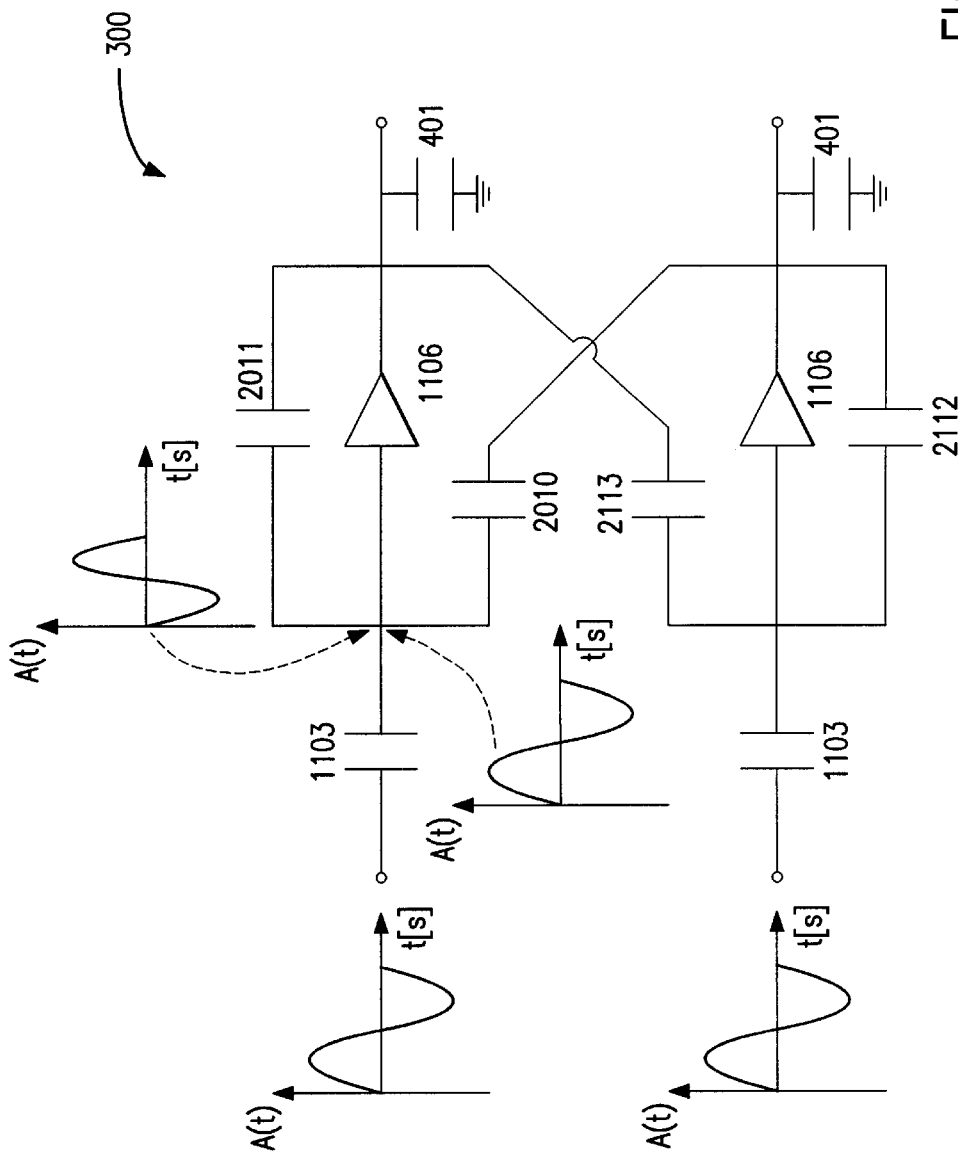
FIG. 4A is a simplified representation of the differential circuit of FIG. 2B, in common-mode operation.

FIG. 4A is a simplified representation of the differential circuit of FIG. 2B functioning in common mode. The 300 circuit comprises two differential amplifiers 1106, input capacitors 1103, feedback capacitors 2010, 2011, 2112, 2113, and output capacitors 302 and 304. In an embodiment of the present invention, the capacitance of the feedback capacitors are equal in value. The capacitance of the input capacitors 1103 differs from the capacitance of the feedback capacitors. The differential amplifiers 1106 function as operational amplifiers. At the input of the 300 circuit a common-mode input signal is present. As represented in the figure, during one half of a period, the signal in the upper input node goes high, while the signal in the lower input node goes high also. Or, the signal in the upper input node goes low, while the signal in the lower input node goes low. The two signals have common portion at the input. At the output of the circuit a purely common-mode signal is present. The arrangement of the feedback capacitors allows that capacitor 2113 feeds back from the output of the upper amplifier 1106 into the upper input of the lower amplifier 1106. Also another feedback capacitor 2010 feeds back from the output of the lower amplifier 1106 into the upper input of the upper amplifier 1106. The feedback capacitors 2113 and 2010 do not cancel each other's effect in common-mode, as they did in differential mode operation. As the amplitude of both output signals goes high, the output signal is the sum of the common-mode input signals.

Figure 4B:
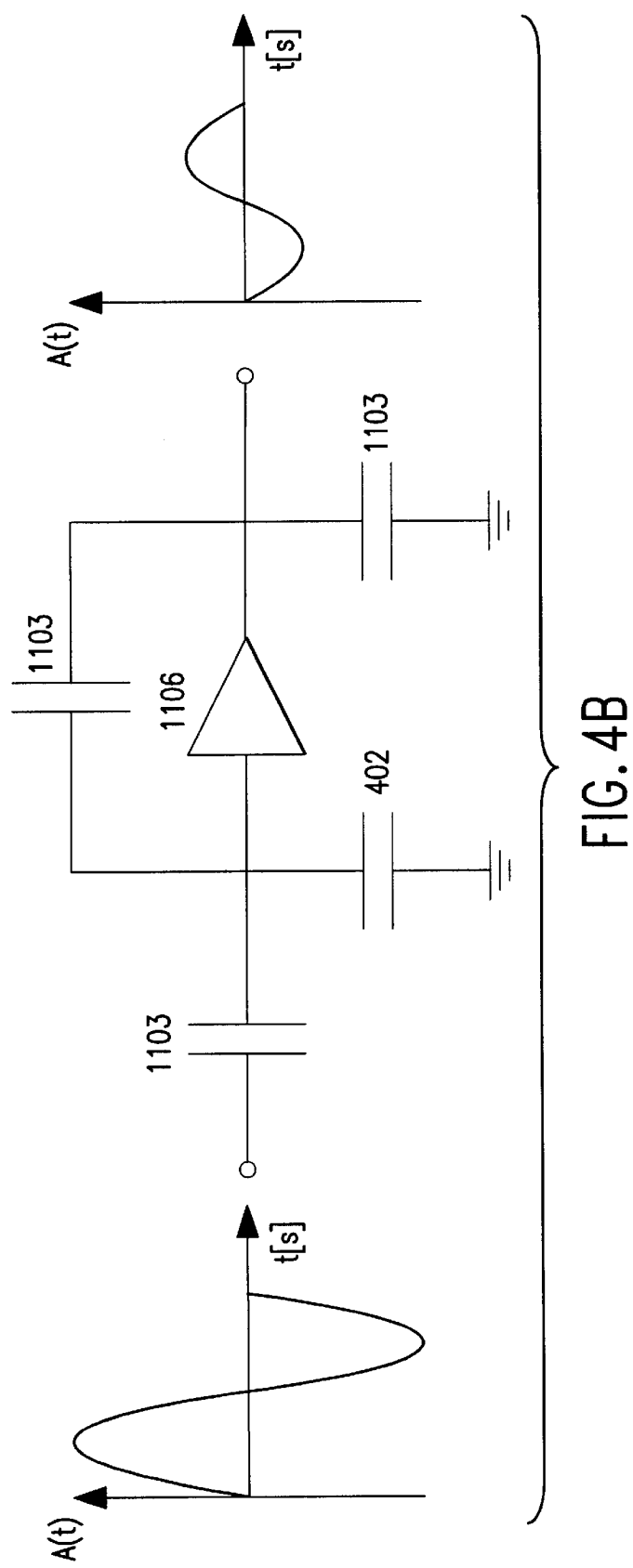
FIG. 4B is an equivalent circuit for the differential circuit of FIG. 4A.

A simplified representation of the circuit of FIG. 4A is shown made in FIG. 4B. The circuit comprises an input node, an input capacitor 1103, a differential amplifier 1106, a parasitic capacitor 402, a feedback capacitor 401, an output capacitor 1103 and an output node. The simplified circuit has performs identically as circuit 300 from FIG. 4A. Capacitor 402 is the parasitic capacitor of the differential operational amplifier 1106. Its capacitance value is the equivalent of the values of the feedback capacitors and the parasitic capacitance of differential amplifier 1106. The presence of feedback capacitor 401 was not necessary to explain the simplified operation of circuit 300 in differential mode. In that case, the signals canceled each other at the input. In common-mode operation, a feedback is present, due to the fact that the input signals add up. In order to overcome the large offsets of the comparator block 106, the pre-amplification has to be made as large as possible. For this purpose several switched capacitor circuits are used. Their association is a cascaded, pipelined structure.

Figure 5A:
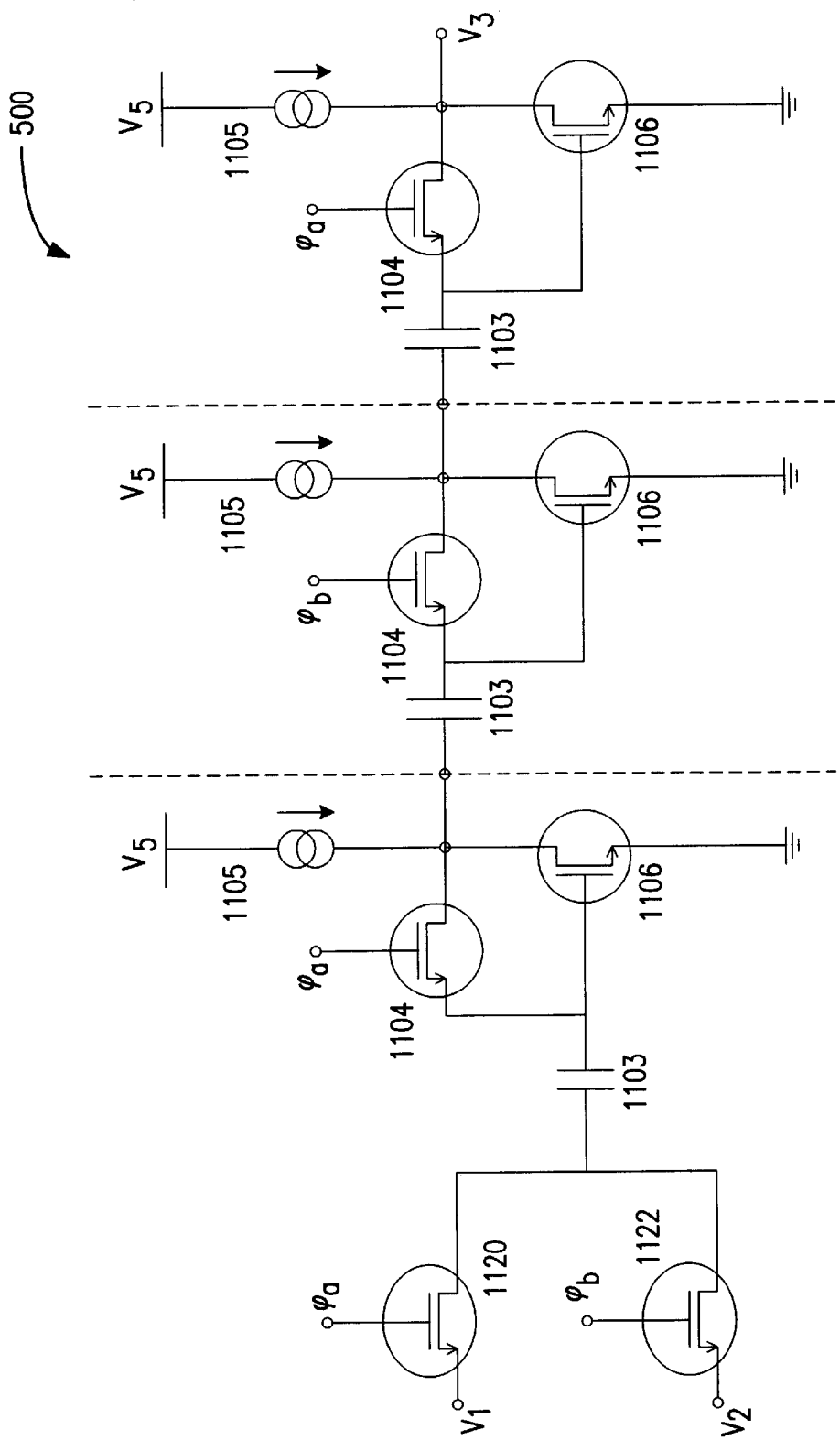
FIG. 5A illustrates a single-ended, cascaded, differential switch-capacitor circuit.

FIG. 5A illustrates a single-ended, cascaded, differential switched-capacitor circuit. This structure pipelines several circuits 1000, as they were represented in FIG. 1C. The first stage of the cascaded structure 500 comprises two input nodes, two switched capacitors 1120 and 1122, an input capacitor 1103, a switched capacitor 1104, an amplifier 1106, a current source 1105, and output node. The two switched capacitors 1120 and 1122 and the switched capacitor 1104 can be driven by a dual clock phase signal. The output node of the fist stage of the cascaded structure is coupled to the next stage. The first lead of an input capacitor 1103 is connected into the output node of the fist stage. The second lead of the input capacitor 1103 is connected into a switched capacitor 1104 and into an amplifier 1106 biased from a current source 1105. The output node of the second stage of the cascaded structure 500 is connected in the same way as previously described with the first lead of a input capacitor 1103. The FIG. 5A illustrates a three stage cascaded structure. But, it would be apparent to a person skilled in the art that this repetitive structure can have more or less than three stages.

When one phase of the clock signal is high, $(\phi_a)$, the first amplifier 1106 has its gate shortened to the drain, as an effect of the position, opened or closed, of switches 1120, 1122 and 1104. If the other phase of the signal, $(\phi_b)$ is high, the position of the switches changes, as it was above explained. The result is that the difference between the corresponding portion of the reference signal and the analog signal is amplified. The amplified signal is stored on the input capacitor of the second stage 1103. The amplification function continues in the subsequent stages, depending whether the position of switch 1104 allows the amplifier 1106 to perform an amplification function. The cascaded, pipe-lined circuit 500 is implemented to achieve sufficient gain to overcome the offset.

Figure 5B:
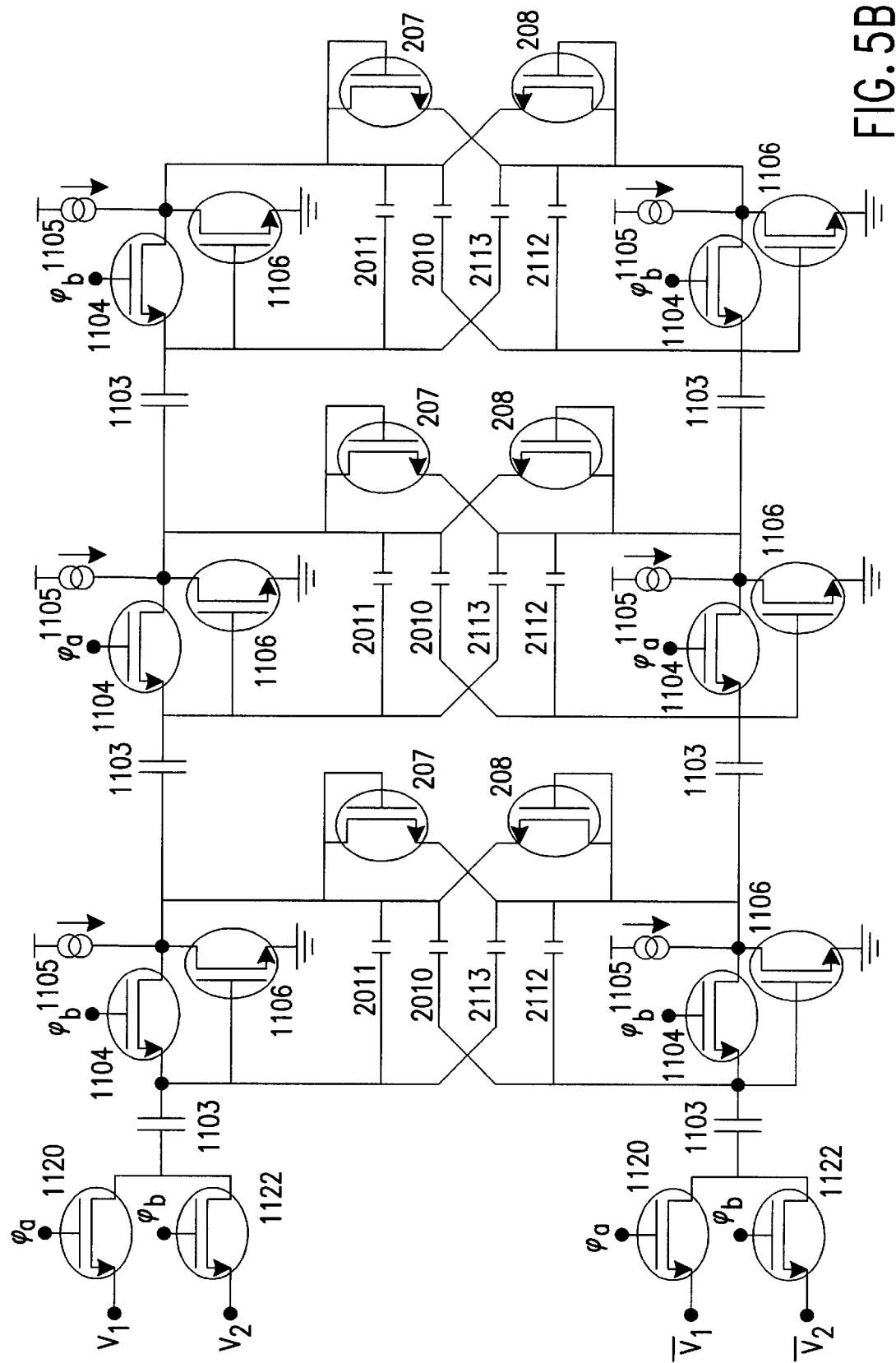
FIG. 5B illustrates a differential implementation of the single-ended circuit of FIG. 5A.

FIG. 5B is a differential representation of the cascaded switched-capacitor circuit of FIG. 5A. Several differential circuits, identical with differential circuit 300 represented in FIG. 2B, have been associated to form a differential, cascaded structure used to pre-amplify the difference between the corresponding portion of the reference voltage and the input voltage. The output of this differential, cascaded structure constitutes an input for the comparing block 106, represented in FIG. 1A.

Figure 6:
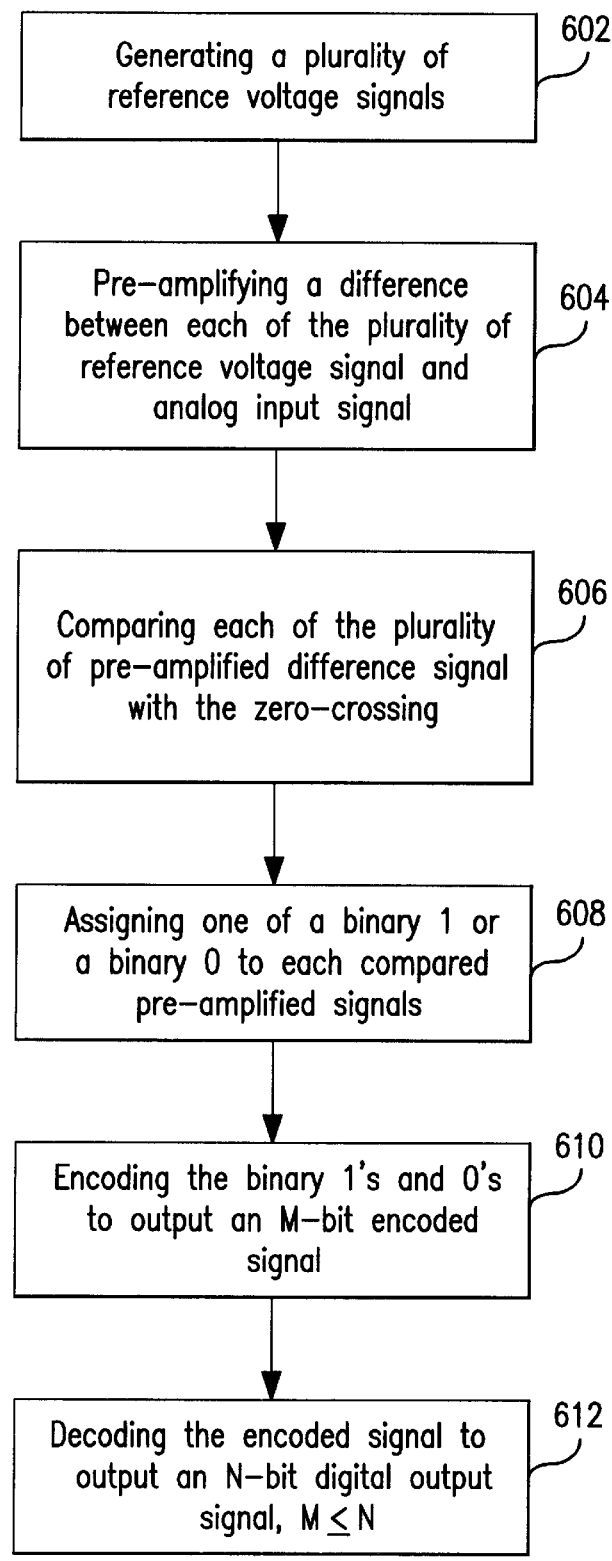
FIG. 6 is an example of a flowchart method for converting an analog input signal to a N-bit digital output signal, according to the present invention.
Figure 3A:
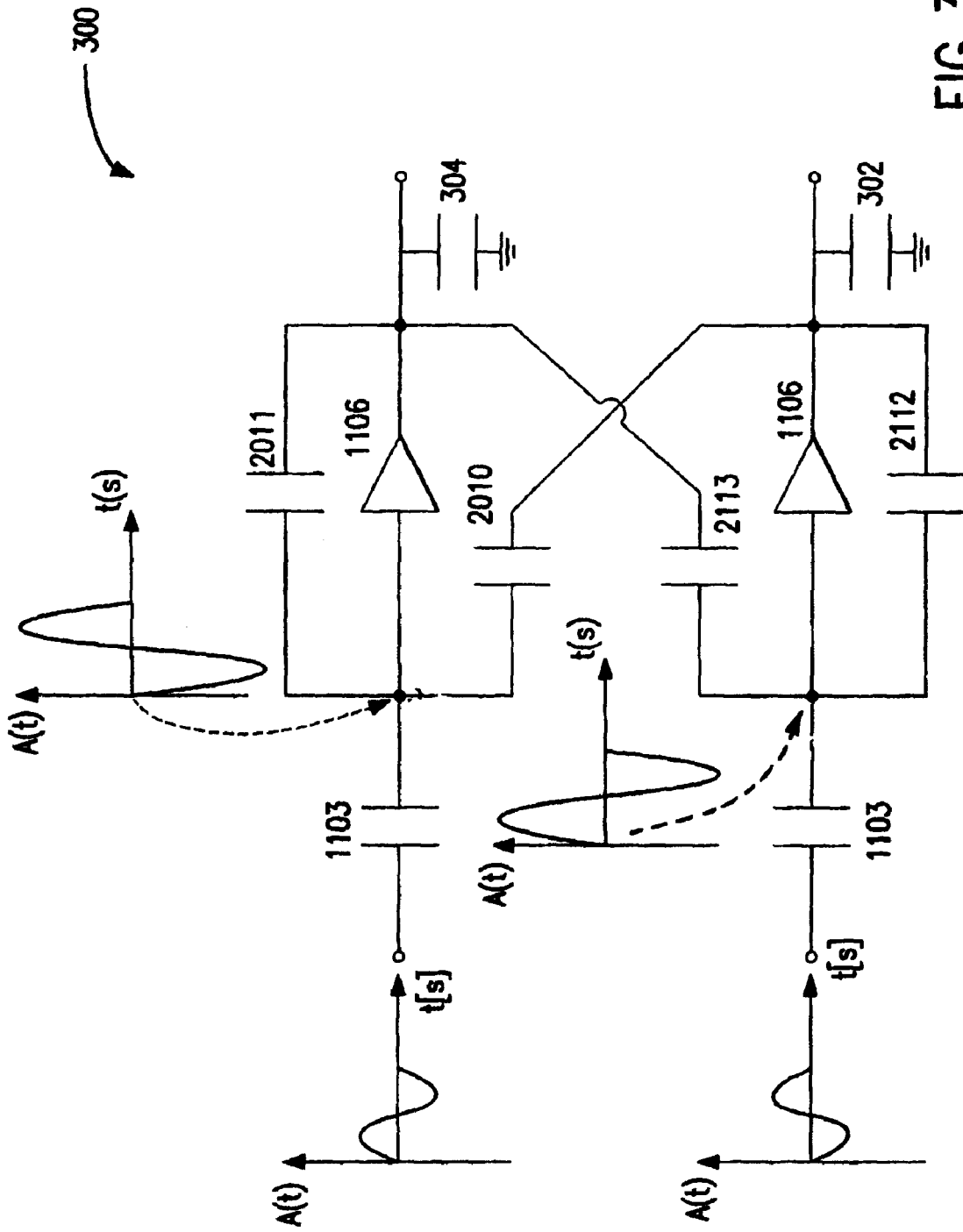
Figure 4A:
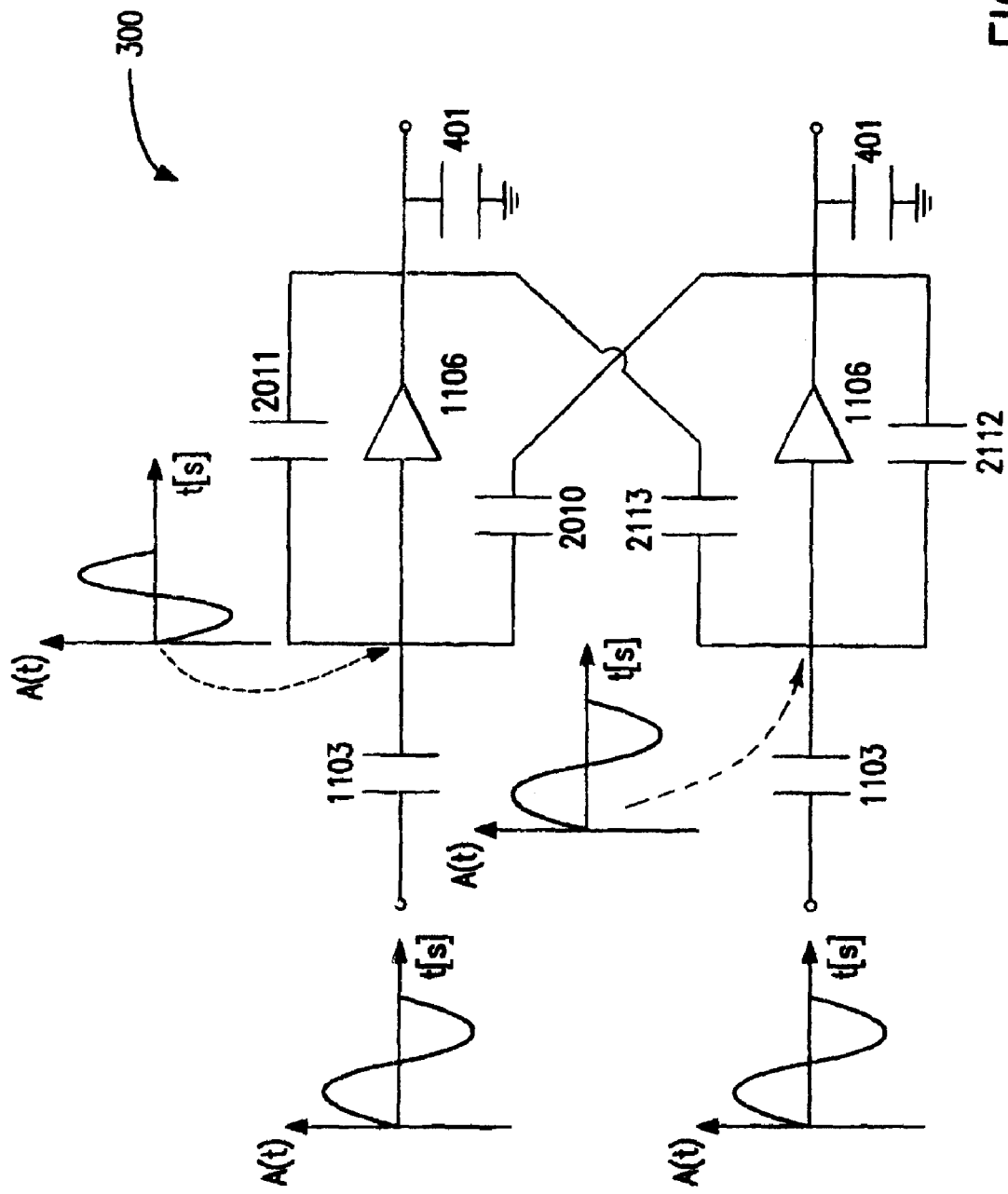

FIG. 6 illustrates an exemplary method of operation of the present invention. An N-bit analog-to-digital converter performs conversion comprising the following steps: generating a plurality of reference voltage signals 602; pre-amplifying, separately, a difference between each of the plurality of reference voltage signals and an analog input signal using a plurality of cascaded, differential, switched-capacitor circuits to output a plurality of pre-amplified difference signals 604; comparing each of the plurality of pre-amplified difference signals with the zero crossing; assigning one of a binary 1 and a binary 0 to each of the compared pre-amplified signals 608; encoding the binary 1's and 0's to output an M-bit encoded signal 610; and decoding the encoded signal to output an N-bit digital output signal, wherein M is less that or equal to N.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks, circuits and method steps illustrating the performance of specified functions and relationship thereof. The boundaries of these functional building blocks and method steps have been arbitrarily defined herein for the convenience of the description. Alternate boundaries can be defined so long as the specified functions and relationships thereof are appropriately performed. One skilled in the art would recognize that these circuits can be implemented by discrete components, application specific integrated components without limiting the breadth and scope of the invention.

What is claimed is:

1. An analog-to-digital converter (ADC) to convert an analog input signal to a N-bit digital output signal, comprising:

a reference voltage generator that outputs a plurality of differential reference voltage signals;

a pre-amplifier having a plurality of cascaded, differential, switched-capacitor circuits, wherein each of said cascaded, differential, switched-capacitor circuits outputs a difference between one of said plurality of reference voltage signals and a differential analog input signal, such that said pre-amplifying block outputs a plurality of pre-amplified difference signals, wherein each of said cascaded, differential, switched-capacitor circuits has pairs of differentially coupled switched-capacitors, amplifiers, input capacitors, feedback capacitors, and output switch limiting transistors, said switched-capacitors receiving a pair of said plurality of differential reference voltage signals and said differential analog input signal, each of said input capacitors being coupled between a respective one of said switched-capacitors and a respective amplifier, each of said feedback capacitors being coupled across an input and an output of its respective amplifier, each of said amplifiers outputting one of said pre-amplified difference signals, and said output switch limiting transistors being coupled between said outputs of said amplifiers;

a comparator that receives said plurality of differential pre-amplified signals and said non-overlapping dual phase clock signal, and assigns one of a binary 1 and a binary 0 to each of said pre-amplified outputs and outputs said binary 1's and 0's to an encoder;

wherein said encoder receives said binary 1's and binary 0's and said non-overlapping dual phase clock signal and outputs a binary code;

a decoder that receives said binary code and outputs a digital signal; and a clock signal line that feeds a non-overlapping dual phase clock signal into said pre-amplifier, said comparator and said decoder.

2. The N-bit ADC of claim 1, wherein said pre-amplifier further comprises a differential cascaded transistor circuit that increases the gain of amplifiers.

3. The N-bit ADC of claim 1, wherein said pre-amplifier further comprises a cascaded, grounded voltage generator that outputs a biasing voltage for said differential cascaded transistor circuit.

4. The N-bit ADC of claim 1, wherein said feedback capacitors are equal value capacitance capacitors.

5. The N-bit ADC of claim 1, wherein said differential switched-capacitor circuits have differential mode operation.

6. The N-bit ADC of claim 1, wherein said differential switched-capacitor circuits have common-mode operation.

7. The N-bit ADC of claim 1, wherein said output switch limiting transistors comprises a transistor configured as a diode to limit the voltage swing of said amplifiers.

8. The N-bit ADC of claim 1, wherein said cascaded differential switched-capacitor circuits consists of a plurality of X successively interconnected stages.

9. A method for converting an analog input signal to a N-bit digital output signal, comprising:

generating a plurality of reference voltage signals;

pre-amplifying, separately, a difference between each of the plurality of reference voltage signals and an analog input signal using a plurality of cascaded, differential, switched-capacitor circuits to output a plurality of pre-amplified difference signals;

determining a zero-crossing result for each of the plurality of pre-amplified difference signals based on the corresponding zero-crossing result;

assigning one of a binary 1 and a binary 0 to each pre-amplified signal;

encoding the binary 1's and 0's to output an M-bit encoded signal; and decoding the encoded signal to output the N-bit digital output signal, wherein M is less that or equal to N.

* * * * *

UNITED STATES PATENT AND TRADEMARK OFFICE
CERTIFICATE OF CORRECTION

PATENT NO. : 6,573,851 B2
DATED : June 3, 2003
INVENTOR(S) : Klaas Bult

It is certified that error appears in the above-identified patent and that said Letters Patent is hereby corrected as shown below:

Title page,
Item [56], References Cited, U.S. PATENT DOCUMENTS, please add the following:
-- US Pat. No. 4,449,118
 US Pat. No. 6,445,331* --
Item [57], ABSTRACT,
Line 2, after "signal" add -- is provided --;
Line 14, "that" should be deleted and replaced with -- than --;

Drawings,
Please replace Fig. 3A with the attached revised Fig. 3A;
Please replace Fig. 4A with the attached revised Fig. 4A;

Column 2,
Line 2, "exist" should be deleted and replaced with -- exists --;
Line 16, "mens" should be deleted and replaced with -- means --;
Line 24, "form" shodul be deleted and replaced with -- from --;
Line 40, "are" should be deleted and replaced with -- is --;
Line 51, "prior being" should be deleted and replaced with -- prior to being --;
Line 53, "objects" should be deleted and replaced with -- objectives --;

Column 3,
Line 34, "cascoded" should be deleted and replaced with -- cascaded --;

Column 4,
Line 9, "pre-amplification block" should be deleted and replaced with -- pre-amplifier block (104) --
Line 36, "decoding block" should be deleted and replaced with -- encoding block (108) --;
Line 40, "decoding" should be deleted and replaced with -- decoder --;
Line 43, "a" should be deleted;
Line 58, "pre-amplification" should be deleted and replaced with -- pre-amplifier --;
Line 58, "pre-amplifying" should be deleted and replaced with -- pre-amplifier --;
Line 63, "multiple switches" should be deleted and replaced with -- switching means --;
Line 64, "mean" should be deleted and replaced with -- means --;
Line 64, "transistors" should be deleted and replaced with -- transistor means --;
Line 64, "single switch" should be deleted and replaced with -- switching means --;

Column 5,
Line 5, "multiple" ahould be deleted;
Line 6, "output" should be deleted and replaced with -- outputs --;
Line 12, "1116" should be deleted and replaced with -- 1115 --;

UNITED STATES PATENT AND TRADEMARK OFFICE
CERTIFICATE OF CORRECTION

PATENT NO.    : 6,573,851 B2
DATED         : June 3, 2003
INVENTOR(S)   : Klaas Bult It is certified that error appears in the above-identified patent and that said Letters Patent is hereby corrected as shown below:

Column 5 (cont'd),
Line 12, "1114" should be deleted and replaced with -- 11105 --;
Line 13, "single" should be deleted;
Lines 13 and 55, -- means -- should be inserted after "-switch";
Line 18, "multiple" should be deleted;
Line 31, "old" should be deleted and replaced with -- hold --;
Lines 41 and 45, "grounded" should be deleted;
Lines 41, 42 and 45, -- means -- should be inserted after "transistor";
Line 47, "1110" should be deleted and replaced with -- 11103 --;
Line 55, -- means -- should be inserted after "switch";

Column 6,
Line 26, "to high or to" should be deleted and replaced with -- too high or too --;
Line 31, "cascoded" should be deleted and replaced with -- cascaded --;
Line 39, "that" should be deleted and replaced with -- than --;
Line 66, "of" should be deleted;

Column 7,
Line 20, "302 and 304" should be deleted and replaced with -- 401 --;

Column 8,
Lines 4 and 6, "fist" should be deleted and replaced with -- first --;
Line 48, after "crossing" insert -- 606 --;

Column 10,
Line 44, "that" should be deleted and replaced with -- than --;

Signed and Sealed this

Thirteenth Day of July, 2004

JON W. DUDAS
*Acting Director of the United States Patent and Trademark Office*